United States Patent
Goyette et al.

(10) Patent No.: US 6,838,933 B2
(45) Date of Patent: Jan. 4, 2005

(54) LOW NOISE AMPLIFIER WITH FIXED LOSS BYPASS

(75) Inventors: William R. Goyette, San Marcos, CA (US); Harry S. Harberts, San Marcos, CA (US); Trung H. Lam, San Diego, CA (US)

(73) Assignee: Northrop Grumman Corporation, Los Angeles, CA (US)

( * ) Notice: Subject to any disclaimer, the term of this patent is extended or adjusted under 35 U.S.C. 154(b) by 0 days.

(21) Appl. No.: 10/630,893

(22) Filed: Jul. 30, 2003

(65) Prior Publication Data

US 2004/0066230 A1 Apr. 8, 2004

Related U.S. Application Data

(60) Provisional application No. 60/415,486, filed on Oct. 2, 2002.

(51) Int. Cl.$^7$ ................................................. H03F 1/14
(52) U.S. Cl. ........................ 330/51; 330/254; 330/307
(58) Field of Search ......................... 330/51, 151, 254, 330/307

(56) References Cited

U.S. PATENT DOCUMENTS

| | | | | | |
|---|---|---|---|---|---|
| 6,078,222 | A | * | 6/2000 | Harris et al. | 330/295 |
| 6,175,274 | B1 | * | 1/2001 | Groe | 330/51 |
| 6,522,195 | B2 | * | 2/2003 | Watanabe et al. | 330/151 |
| 6,668,164 | B2 | * | 12/2003 | Hughes | 330/278 |

* cited by examiner

Primary Examiner—Khanh V. Nguyen
(74) Attorney, Agent, or Firm—Noel F. Heal

(57) ABSTRACT

A low noise amplifier (LNA) has a selectable bypass signal path integrated into the same integrated circuit (IC) as the amplifier components. In a normal mode of operation, an integrated mode switch allows an appropriate biasing signal to be applied LNA transistors, which function to amplify an input signal and produce an amplified output signal. In an attenuation mode, which is activated to handle large input signals, the LNA transistors are switched off and the input signal is attenuated by a voltage divider, which provides an attenuated output on a signal path that bypasses the LNA amplifier. An attenuation switching signal not only operates the mode switch in the LNA, but also selects between the normal and bypass outputs of the LNA, for further amplification downstream of the LNA.

6 Claims, 2 Drawing Sheets

LOW NOISE AMPLIFIER WITH FIXED LOSS BYPASS

CROSS-REFERENCE TO RELATED APPLICATION

This application claims, under 35 U.S.C. §119(e), the filing priority of Provisional Application No. 60/415,486, filed Oct. 2, 2002, and having the same title as the present invention.

BACKGROUND OF THE INVENTION

The present invention relates generally radio frequency (RF) amplifiers and, more particularly, to RF amplifiers that have a switched attenuator function. Modern digital communications systems employ highly complex and highly precise modulation waveforms in order to maximize utilization and revenue from precisely assigned radio frequency band allocations. The front-end wireless receiver circuits for these sophisticated communications systems often require a switched attenuator function (for example, in the range of 10 to 30 dB) to suppress very strong signals either due to short transmission range or to unwanted high powers at long range. This suppression must keep the signal linear so that it may be properly processed by the receiving system, yet, at the same time, must not adversely affect the low noise amplification of weak desired signals in any way.

Typically this circuit is implemented with discrete components due to the high power involved and due to tight requirements on matching impedance and linearity. These components require significant printed wiring board (PWB) area and thus are costly for production communications systems. Accordingly, it would be highly desirable to provide an amplifier with a switched attenuator function, but without the foregoing disadvantages. The present invention is directed to this end.

SUMMARY OF THE INVENTION

The present invention provides an RF integrated circuit (IC) amplifier with a switched attenuator function integrated with the amplifier circuit. Moving the switched attenuator function "on chip" avoids the disadvantages mentioned above and reduces the circuit parts count. There are, however, several challenges associated with implementation of this functionality on chip. A switched attenuator must be accurate and repeatable with respect to gain step. In an RF circuit, matching impedance must also be maintained. In the attenuation mode, the input signal is typically high power, thus requiring the circuitry to be highly linear. Finally, for large attenuation steps high isolation between the main and bypass paths is required.

The present invention moves the switched attenuation function on chip in a novel fashion by incorporating a bypass path into a Low Noise Amplifier (LNA) architecture with a separate output. In the presence of a strong signal, the bypass path is activated, along with attenuation, in the LNA and the received signal is routed to subsequent amplification stages on a separate input. In this way the sensitive components in the low noise amplification path do not have to deal with the strong signal.

Briefly, and in general terms, the amplifier of the invention comprises a low noise amplifier (LNA) having an input line, a normal output line, a bypass output line and an attenuation control input line; and a differential switched gain amplifier (DSGA) connected downstream of the LNA and including means for selecting between inputs from the normal output line and the bypass output line from the LNA. A control signal on the attenuation control input line permits switching the LNA between a normal mode of operation in which signals on the input line are amplified in the LNA and then passed to the DSGA, and a bypass mode of operation in which signals on the input line are attenuated and passed directly to the DSGA.

It will be appreciated from the foregoing that the present invention represents a significant advance in the field of low noise RF amplifiers having an attenuation mode of operation. Specifically, the invention provides an amplifier with a bypass attenuation mode path integrated into the same circuit as the low noise amplifier components, thereby avoiding the use of costly off-chip components for this purpose. Other aspects and advantages of the invention will become apparent from the following more detailed description of the invention, taken together with the accompanying drawings.

DETAILED DESCRIPTION OF THE INVENTION

Figure 1:
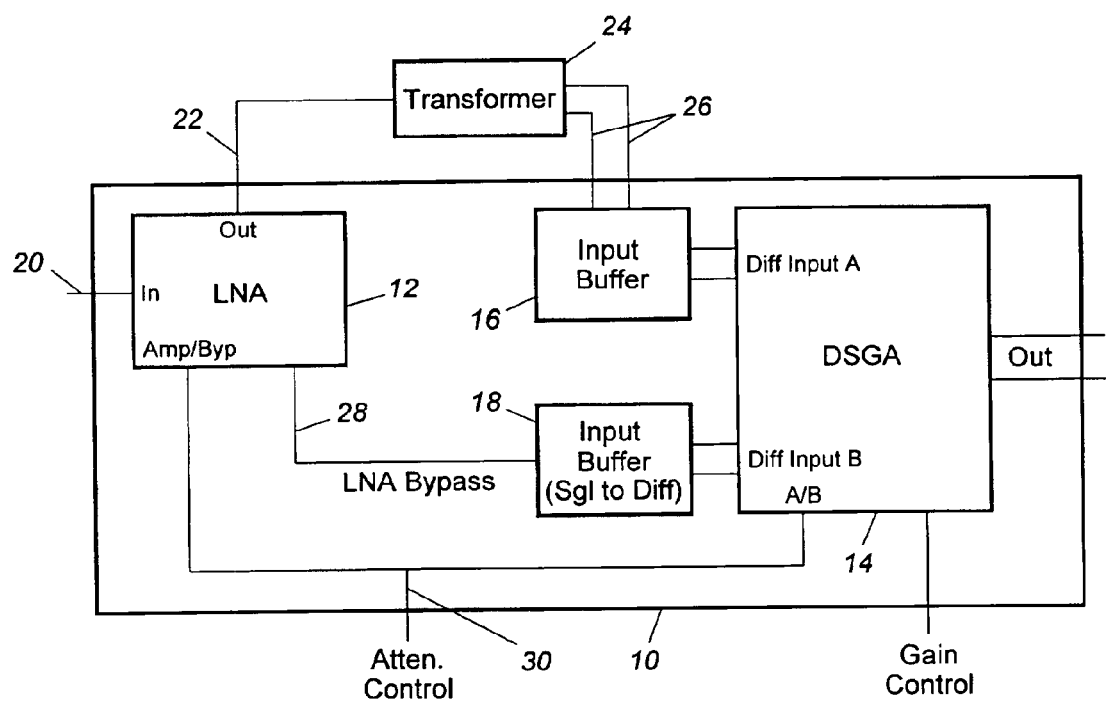
FIG. 1 is a block diagram illustrating the circuit of the invention.

As shown in the drawings for purposes of illustration, the present invention pertains to low noise radio-frequency (RF) amplifiers having a switched attenuator function. In the block diagram of FIG. 1, the amplifier of the invention, which is typically used in the "front end" of an RF receiver, is implemented as an integrated circuit (IC), indicated generally by reference numeral 10. The IC amplifier 10 contains a single ended low noise amplifier (LNA) 12 followed by a differential switched gain amplifier (DSGA) 14, which has two input buffers 16 and 18, the input buffer 18 including a single-ended to differential conversion.

The LNA 10 has an input signal line 20 and a normal output signal line 22, which is coupled to a single-ended signal to differential signal transformer 24, shown as being located outside the IC amplifier 10, although it may also be located on chip in some designs. Differential signals from the transformer 24 are connected by lines 26 to input buffer 16, which is in turn coupled to differential input A of the DSGA 14. The LNA 12 also has a bypass output line 28, which is coupled to input buffer 18, where the bypass signals are converted to differential format and applied to differential input B of the DSGA 14.

There are two modes of operation depending on whether the attenuation is switched out (Bypass Off) or switched in (Bypass In), as determined by an attenuation control signal on line 30. This signal is connected to the LNA 12 to control switching between the two modes, and to the DSGA to control selection between differential inputs A and B. In the Bypass Off mode, the LNA output is routed to the transformer 24 to create a differential signal that is routed back into the DSGA through input buffer 16. This is the normal mode of operation, with the bypass off. The bypass circuitry in this off mode is a high impedance network on the LNA input that does not significantly affect the input return loss (matching impedance), gain, linearity or noise performance of the LNA. In the Bypass On mode, "bypass attenuation" is achieved in two steps. When the attenuation is triggered (by the attenuation control signal on line 30), the LNA bias is shut off (to preserve linearity and enhance isolation), but the signal still appears at the LNA input. The LNA power down circuitry incorporates a controlled shunt impedance to maintain excellent return loss in the bypass mode. As will be further described with reference to FIG. 2, this input signal is voltage divided down to a lower value and is routed into a secondary path into the DSGA (LNA bypass path 28). The DSGA 14 includes an input stage that provides a high isolation, two channel multiplexer function and is switched in the Bypass On mode from the off chip differential input (A) to on chip single ended high impedance input (B). The difference between the baseline LNA gain, and the Bypass Attenuation level provides the desired attenuation step.

Figure 2:
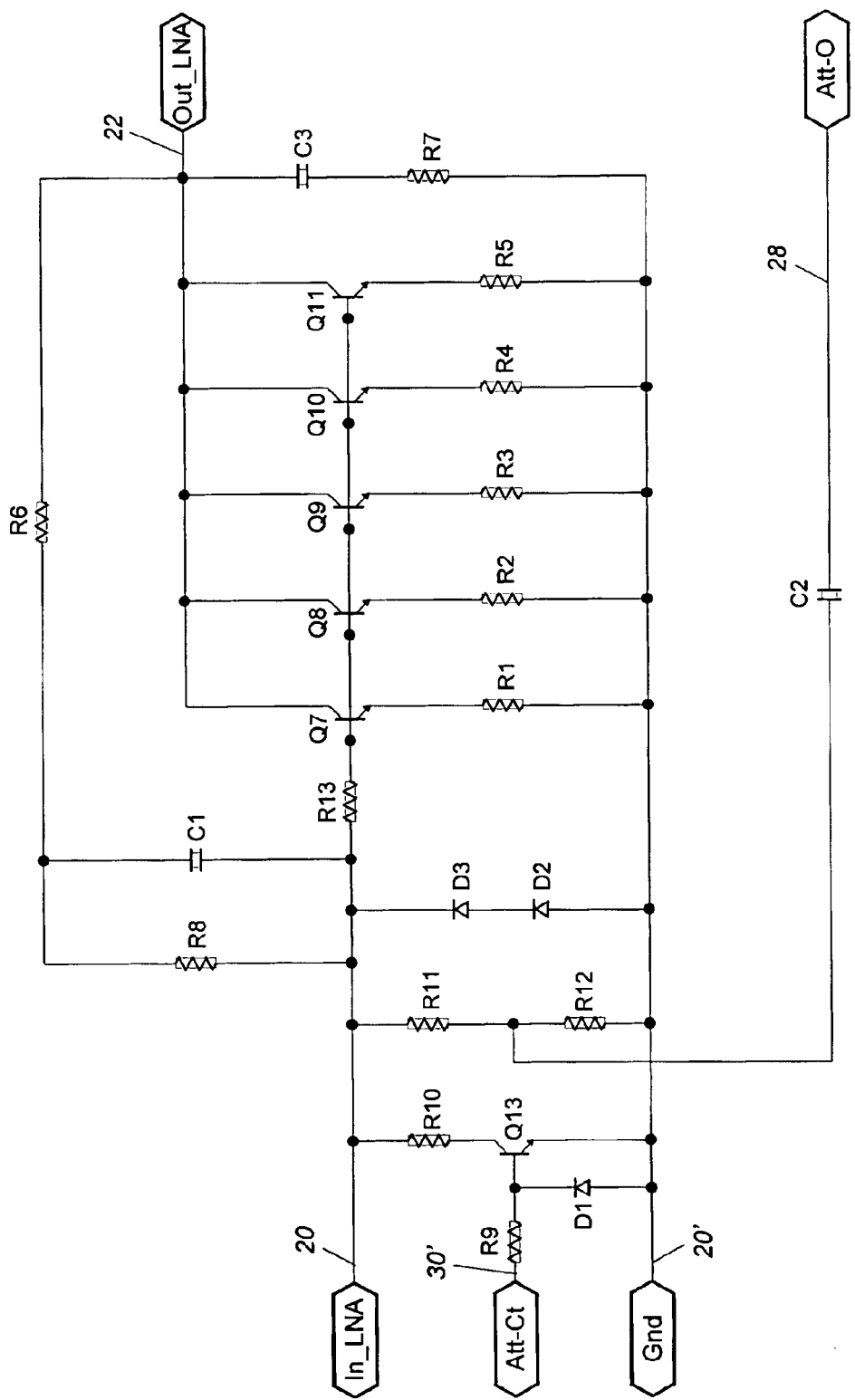
FIG. 2 is a schematic diagram of the low noise amplifier (LNA) of the invention.

FIG. 2 shows the architecture of LNA 12 in detail. Input signals are coupled to the LNA 12 on line 20 and there is a ground line, referred to as 20'. The LNA 12 includes a bypass switch, in the form of transistor Q13, which is connected, in series with a resistor R10, between the input line 20 and the ground line 20'. The attenuation control signal on line 30 is applied to the base of transistor Q13 through a resistor R9 and a diode D1 is connected between the base of the transistor and the ground line 20'. Also connected between the input line 20 and the ground line 20' is a resistive voltage divider comprising series-connected resistors R11 and R12, the junction between these resistors being connected through series capacitor C2 to the bypass output line 28.

Resistors R6 and R8 and capacitor C1 together comprise the on chip portion of an LNA bias network. Resistors R6 and R8 are connected in series between the output line 22 and the input line 20, and capacitor C1 is connected in parallel with resistor R8. Additional bias components, which are not critical to the invention, are located off chip and connected to the "OUT_LNA" (line 22 in FIG. 1). The LNA 12 as implemented includes five NPN transistors Q7, Q8, Q9, Q10 and Q11 connected essentially in parallel. That is to say, the collectors are connected in common to the output line 22, the bases are connected in common to the input line 20 through a series resistor R13, and the emitters are connected to the ground line 20' through resistors R1-R5, respectively. The only other components not mentioned thus far are a capacitor C3 and resistor R7 connected between the output line 22 and ground, and a pair of diodes D2 and D3 connected between the ground line 20' and the input line 20.

When the attenuation control ("att-ct") signal (line 30 in FIG. 1) is low, transistor Q13 is switched off and presents a high impedance to the LNA input 20. The LNA 12 is then in normal mode. At the same time, Input A of the DSGA 14 is selected by the a low attenuation control signal on line 30. When the attenuation control signal ("att-ct") is high, transistor Q13 turns on and pulls LNA base bias voltage low by shunting the bias current through resistor R10 to ground. This action shuts off the amplifier. Resistor R10 is sized to present an adequate input match at the LNA input 20 ("IN_LNA"). When this occurs, the output line 22 ("OUT_LNA") has no discernable signal. The ratio of the resistance values of resistors R12 and R11 in the divider network determines the further reduction of the input signal. The attenuated signal then passes through the DC blocking cap C2 and over line 28 to the "sgl to diff" input buffer 18, and finally into the DSGA 14 via input path B.

In summary, the LNA 12 uses mode switching transistor Q13 to switch between a normal mode in which input signals on line 20 are amplified by transistors Q7-Q11 and are output on line 22, and an attenuation mode in which the transistors Q7-Q11 are switched off and an attenuated portion of the input signal on line 20 is output over bypass output line 28, for amplification in the DSGA 14. Thus, instead of using expensive discrete components to invoke two separate signal paths for attenuated and non-attenuated conditions, the invention provides that all of the attenuated condition signal paths are integrated onto a single preamplifier integrated circuit (IC). Accordingly, fewer discrete components are required to implement a switched attenuator, with a resultant saving in cost of PWB layout space.

It will be appreciated that, although a specific embodiment of the invention has been described in detail for purposes of illustration, various modifications may be made without departing from the spirit and scope of the invention. Accordingly, the invention should not be limited except as by the appended claims.

What is claimed is:

1. An integrated-circuit (IC) radio-frequency amplifier having normal and attenuation modes, the amplifier comprising:
   a low noise amplifier (LNA) having an input line, a normal output line, a bypass output line and an attenuation control input line; and
   a differential switched gain amplifier (DSGA) connected downstream of the LNA and including means for selecting between inputs from the normal output line and the bypass output line from the LNA;
   wherein a control signal on the attenuation control input line permits switching the LNA between a normal mode of operation in which signals on the input line are amplified in the LNA and then passed to the DSGA, and a bypass mode of operation in which signals on the input line are attenuated and passed directly to the DSGA.

2. An amplifier as defined in claim 1, and further comprising:
   signal transforming means for converting single-ended signals on the normal output line and the bypass output line to differential signals for input to the DSGA.

3. An amplifier as defined in claim 2, wherein the signal transforming means comprises first signal transforming means for converting the signals on the normal output line and second signal transforming means for converting the signals on the bypass output line.

4. An amplifier as defined in claim 3, wherein the first signal transforming means is not integrated with the other components of the amplifier.

5. An amplifier as defined in claim 3, wherein:
   the DSGA further comprises first and second input buffers for processing signals on the normal output line and the bypass output line, respectively; and
   the second signal transforming means is integrated into the second input buffer.

6. An amplifier as defined in claim 1, wherein the LNA further comprises:
   a mode switching transistor connected in series with a resistor between the input line and a ground line, wherein the attenuation control input line is connected to control the state of the mode switching transistor, which is arranged to permit normal operation of the amplifier in a normal mode, but to disable normal operation of the amplifier in an attenuation mode; and
   a voltage divider providing an attenuated portion of a signal on the input line to the bypass output line;
   and wherein the means for selecting between inputs to the DSGA is controlled by the attenuation control signal, to provide for connection of the bypass output line to the DSGA input when the attenuation mode is selected.

* * * * *